United States Patent
Pressman et al.

(10) Patent No.: US 11,637,421 B2
(45) Date of Patent: Apr. 25, 2023

(54) GROUND IMPEDANCE AND FAULT DETECTION SYSTEM AND METHOD

(71) Applicant: Transportation IP Holdings, LLC, Norwalk, CT (US)

(72) Inventors: Jacob Pressman, Erie, PA (US); Neil Burkell, Erie, PA (US); Ajith Kuttannair Kumar, Erie, PA (US); Bret Worden, Erie, PA (US); Robert Zill, Erie, PA (US)

(73) Assignee: TRANSPORTATION IP HOLDINGS, LLC, Norwalk, CT (US)

( * ) Notice: Subject to any disclaimer, the term of this patent is extended or adjusted under 35 U.S.C. 154(b) by 110 days.

(21) Appl. No.: 17/372,133

(22) Filed: Jul. 9, 2021

(65) Prior Publication Data
US 2023/0010565 A1   Jan. 12, 2023

(51) Int. Cl.
| | | |
|---|---|---|
| H02H 3/04 | (2006.01) | |
| H02H 1/00 | (2006.01) | |
| H02H 7/18 | (2006.01) | |
| H02H 3/16 | (2006.01) | |

(52) U.S. Cl.
CPC .......... *H02H 3/042* (2013.01); *H02H 1/0007* (2013.01); *H02H 3/16* (2013.01); *H02H 7/18* (2013.01)

(58) Field of Classification Search
CPC ........ H02H 3/042; H02H 1/0007; H02H 3/16; H02H 7/18
See application file for complete search history.

(56) References Cited

U.S. PATENT DOCUMENTS

| | | | | |
|---|---|---|---|---|
| 8,035,396 | B2* | 10/2011 | Kim ..................... | G01R 31/385 |
| | | | | 324/426 |
| 10,985,553 | B2* | 4/2021 | Shin .................... | H01M 50/574 |
| 2014/0095093 | A1* | 4/2014 | Hong ................. | G01R 31/1227 |
| | | | | 702/63 |
| 2014/0301000 | A1* | 10/2014 | Takahashi .............. | G01R 31/52 |
| | | | | 361/42 |
| 2016/0261127 | A1 | 9/2016 | Worry et al. | |
| 2020/0142007 | A1 | 5/2020 | Aggeler et al. | |
| 2020/0144812 | A1* | 5/2020 | Shin .................... | G01R 31/385 |
| 2021/0055356 | A1 | 2/2021 | Stafl | |

OTHER PUBLICATIONS

Search Report dated Nov. 25, 2022 for corresponding European Patent Application No. 22181896.6 (9 pages).

* cited by examiner

*Primary Examiner* — Jared Fureman
*Assistant Examiner* — Nicolas Bellido
(74) *Attorney, Agent, or Firm* — The Small Patent Law Group LLC; Christopher R. Carroll

(57) ABSTRACT

A system and method that identify a location and/or magnitude of a ground fault in a circuit having a bus that connects battery strings with loads and a ground reference between the loads are provided. Potential of the bus is shifted relative to a ground reference in a first direction. A first impedance in the bus between the battery strings and the ground reference is determined, and the bus is shifted relative to the ground reference in a second direction. A second impedance in the bus between the battery strings and the ground reference is determined. A location and/or severity of a ground fault is determined based on a relationship between the first impedance and the second impedance.

20 Claims, 6 Drawing Sheets

GROUND IMPEDANCE AND FAULT DETECTION SYSTEM AND METHOD

BACKGROUND

Technical Field

The subject matter described herein relates to detection of ground faults within energy storage systems.

Discussion of Art

A variety of energy storage systems may use electric energy stored in batteries to power one or more components of a powered system. There may be many opportunities for ground faults to occur in the energy storage systems. Energy storage devices and systems are becoming more prolific, which may create more potential failure points. Additionally, energy storage devices are being used in more safety critical applications (such as self-driving cars at high speeds), and the voltages of these devices continues to increase, which increases the risk of ground faults. Detection of ground faults as early as possible is desirable, as the second or additional ground faults can be detrimental or disastrous to the energy storage systems.

Some known ground fault detection systems require the addition of significant equipment and/or dedicated passive circuits to detect ground faults. Both can lead to high cost and extra components to package with the energy storage systems. Also, other systems can have blind spots where a ground fault failure may go undetected.

Therefore, a need exists for systems and methods for detecting ground faults in energy storage systems, that do not require the addition of significant equipment or dedicated passive circuits.

BRIEF DESCRIPTION

In one embodiment, a method for identifying a location and/or magnitude of a ground fault in a circuit having a bus that connects battery strings with loads and a ground reference between the loads is provided. The method can include shifting the bus of the circuit relative to the ground reference in a first direction, determining a first impedance in the bus between the battery strings and the ground reference, shifting the bus of the circuit relative to the ground reference in a second direction, determining a second impedance in the bus between the battery strings and the ground reference, and identifying a location and/or severity of the ground fault based on a relationship between the first impedance and the second impedance.

In one embodiment, another method is provided that includes activating an inverter coupled with at least one battery string having two or more battery cells. The inverter is activated at a first frequency to one or more of send first current to or draw the first current from the at least one battery string. The method also includes determining the first current that is sent to or drawn from the at least one battery string, activating the inverter at a second frequency to one or more of send second current to or draw the second current from the at least one battery string, determining the second current that is sent to or drawn from the at least one battery string, determine an impedance and phase angle of the impedance from the first current and the second current that are measured, and identifying an insulation fault in a circuit having the at least one battery string and the inverter, the insulation fault identified responsive to the phase angle exceeding a threshold or the phase angle changing with respect to time.

In one embodiment, a system (e.g., a ground impedance and fault detection system) is provided and includes a controller configured to identify a location of a ground fault in a circuit having a bus that connects battery strings with loads and a ground reference between the loads. The controller is configured to identify the location of the ground fault by shifting the bus of the circuit relative to the ground reference in a first direction, determine a first impedance in the bus between the battery strings and the ground reference, shifting the bus of the circuit relative to the ground reference in a second direction, determine a second impedance in the bus between the battery strings and the ground reference, and identify a battery cell of several battery cells in the battery strings as having the ground fault based on a relationship between the first impedance and the second impedance.

BRIEF DESCRIPTION OF THE DRAWINGS

The inventive subject matter may be understood from reading the following description of non-limiting embodiments, with reference to the attached drawings, wherein below.

DETAILED DESCRIPTION

Embodiments of the subject matter described herein relate to energy storage system with ground impedance and/or fault detection capabilities and associated methods that determine ground impedances, which can be used to detect ground faults in the energy storage systems. The energy storage systems can have energy storage devices, such as battery cells. The systems and methods may be cost-effective to implement by changing or adding to the software or other programming of controllers of the energy storage systems. Energy storage devices can be connected and/or disconnected using a set of switches (contactors, etc.) for protection of the energy storage devices. The energy storage devices may have impedances that are referenced to the ground reference on a conductive battery bus (that conductively couples the energy storage devices) to measure voltage, serve as high voltage indicators, or the like. These impedances can be on either side of the switches and be used to shift or otherwise move the ground reference when opening or closing the switches. Shifting the ground reference brings visibility to faults in the energy storage systems using existing components in the powered system, such as precharge resistors, inverters, isolation contactors, etc. The inverter (or like switching component) can also be used to accomplish tests such as a tan delta test without additional components.

Detection can be accomplished without adding extra components to package and the high cost that comes along with the additional components. Any space that is taken up by other components is less space for stored energy and is more cost in the powered system.

In one embodiment, voltage measurements in an energy storage system are used to determine ground impedances, which can be used to detect the magnitude and location of ground faults within the energy storage system. The ground reference of the energy storage system can be shifted by closing a switch (e.g., an isolation string contactor) to determine a ground impedance. When this impedance decreases below a designated threshold impedance, then a ground fault may be detected. The threshold impedance may change based on the battery cells (e.g., the chemistries of the cells, whether the cell are in parallel or series, power levels of the cells, voltages of the cells, temperatures of the cells, ages of the cells, etc.). Responsive to detection of the ground fault, an alarm or other notification to an operator may be generated, operation of a powered system (e.g., a vehicle or stationary system) that is at least partially powered by the energy storage system can be changed or deactivated, or the like.

Figure 1:
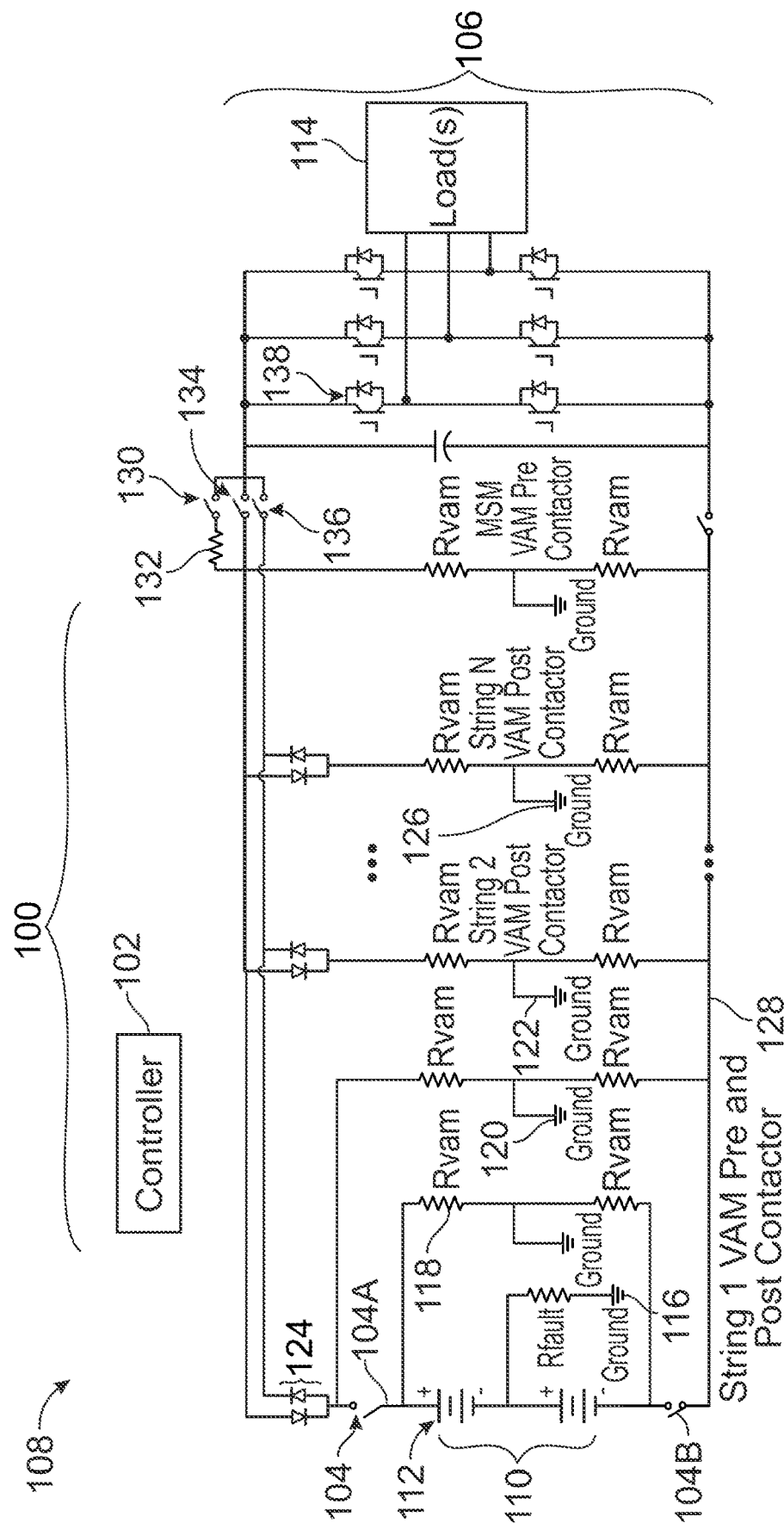
FIG. 1 illustrates one example of an energy storage system with ground impedance and/or fault detection capabilities.

FIG. 1 illustrates one example of an energy storage system 100. The system includes a controller 102 that operates to control states of electrically controllable switches 104 (e.g., switches 104A, 104B) in a circuit 106 of a powered system 108. The circuit includes a conductive bus 128 that conductively connects the components of the circuit with each other. This bus can represent one or more wires, traces, cables, or the like. The switch 104A can be referred to as a positive side switch as this switch is between the positive terminal, end, or output of the strings and the remainder of the circuit. The switch 104B can be referred to as a negative side switch as this switch is between the negative terminal, end, or output of the strings and the remainder of the circuit. The switches can be contactors or other types of electrical switches. The number and/or arrangement of the components of the circuit shown in FIG. 1 are provided merely as one example. Additional or fewer components may be provided, and/or the components may be in a different arrangement than what is shown.

The controller can represent hardware circuitry that includes and/or is connected with one or more processors (e.g., one or more integrated circuits, one or more field programmable gate arrays, one or more microprocessors, etc.) that operate to send signals via conductive pathways (e.g., wires, cables, conductive buses, conductive traces, etc.) and/or to send the signals wirelessly to the switches to control which switches are open, which switches are closed, and when switches are opened or closed. The controller can automatically generate these signals and/or can generate the signals based on input (e.g., from an operator and/or the powered system).

The circuit includes one or more strings 110 of battery cells 112 that supply energy (e.g., direct current) to one or more loads 114 of the powered system to power the loads. As described herein, a battery cell can refer to an electrochemical cell that is a device capable of generating electric energy from chemical reactions and/or storing electric energy for later use. A cell group can refer to two or more battery cells connected in parallel to each other. A cell stack can refer to two or more cell groups that are connected in series with each other. A pack can refer to two or more cell stacks connected in series with each other, and which optionally can be disposed in a packaging or housing. A string can refer to two or more packs connected in series with each other. Optionally, one or more of the switches may be disposed between subparts of at least one of the strings. For example, the positive side switch and/or negative side switch may be disposed between cells, between cell groups, between cell stacks, or between packs in a string.

The circuit can include a charging switch or contactor 134 that is opened or closed to couple the strings with the loads and a discharging switch or contactor 136 that is opened or closed to couple the strings with the external power source for charging the strings. The circuit can include a precharge switch or contactor 130 that is used to connect or disconnect the strings and the bus with a resistive element or load 132 to precharge the bus prior to closing the charging and discharging switches or contactors to couple the strings to the load and/or prior to closing the positive and negative side switches to couple an external power source (e.g., a utility grid, a generator, a traction motor operating as a generator, etc.) to the strings to charge the strings. The circuit can include inverters 138 that control conduction of the current from the strings to the load(s). The inverters can fire (e.g., close) at different times to convert the direct current supplied from the strings to an alternating current that is supplied to the load(s).

The powered system can represent a stationary or mobile system that is at least partially powered by electric energy stored in battery cells within the battery strings. For example, all of the energy demand of the powered system may be provided by the battery strings or less than all of the energy demand of the powered system may be provided by the battery strings. The powered system can be a vehicle, such as a mining vehicle, rail vehicle, automobile, truck, bus, marine vessel, agricultural vehicle, or the like. The loads can represent motors, lamps, processors, blowers, or the like.

The circuit includes a first ground reference connection 116 ("Ground" in FIG. 1) coupled with the strings by an impedance device 118 ("Rvam" in FIG. 1) in a location between the strings. The ground reference connections described herein connect the circuit with the earth ground reference or another ground reference (e.g., a vehicle body or chassis). The impedance device can represent a load of the circuit. By way of example, the impedance device can represent a lamp or light emitting diode, a voltage amplifier, a grid resistor, or the like. Optionally, the impedance device can represent a sensor that measures impedance, voltage, or the like, at the locations labeled in FIG. 1 (e.g., a voltmeter and ammeter, or Rvam). The impedance device can be used to measure an impedance when the device is powered by the string(s), as described herein. The impedance device between the ground reference and the positive side switch (or the positive end of the strings) can be referred to as the positive side impedance device. The impedance device between the ground reference and the negative side switch (or the negative end of the strings) can be referred to as the negative side impedance device.

The circuit includes a second ground reference connection 120 that is coupled with the strings by additional impedance devices in locations between each of the strings and the switches. A third ground reference connection 122 is coupled with the strings by additional impedance devices in a location between the positive side switch and a set of diodes 124 and in another location between the negative side switch and the load(s). One or more additional ground reference connections 126 are coupled with the strings by additional impedance devices and sets of diodes. The energy storage system optionally may have other equivalent strings disposed in parallel to the string shown in FIG. 1. These additional ground reference connections are coupled with the positive side switch by the sets of diodes between the positive side switch and the load(s) and are coupled with the negative side switch. One or more additional or fewer ground reference connections may be provided than what is shown in FIG. 1 (as represented by the ellipses in FIG. 1).

A ground fault in the strings can be made to be apparent (or more apparent) by mismatches in string positive and negative voltage measurements with respect to a ground reference. Comparing characteristics such as impedances (that can be calculated using these measured voltages), voltages, or the like, with respect to the ground before and after closing the switches can reveal the magnitude and location of ground faults. Closing the positive side switch or the negative side switch between measurements of the characteristics can shift the ground reference of the circuit to enable the magnitude and location of the ground fault to be identified. The magnitude of the ground fault is labeled as "Rfault" in FIG. 1.

Figure 2:
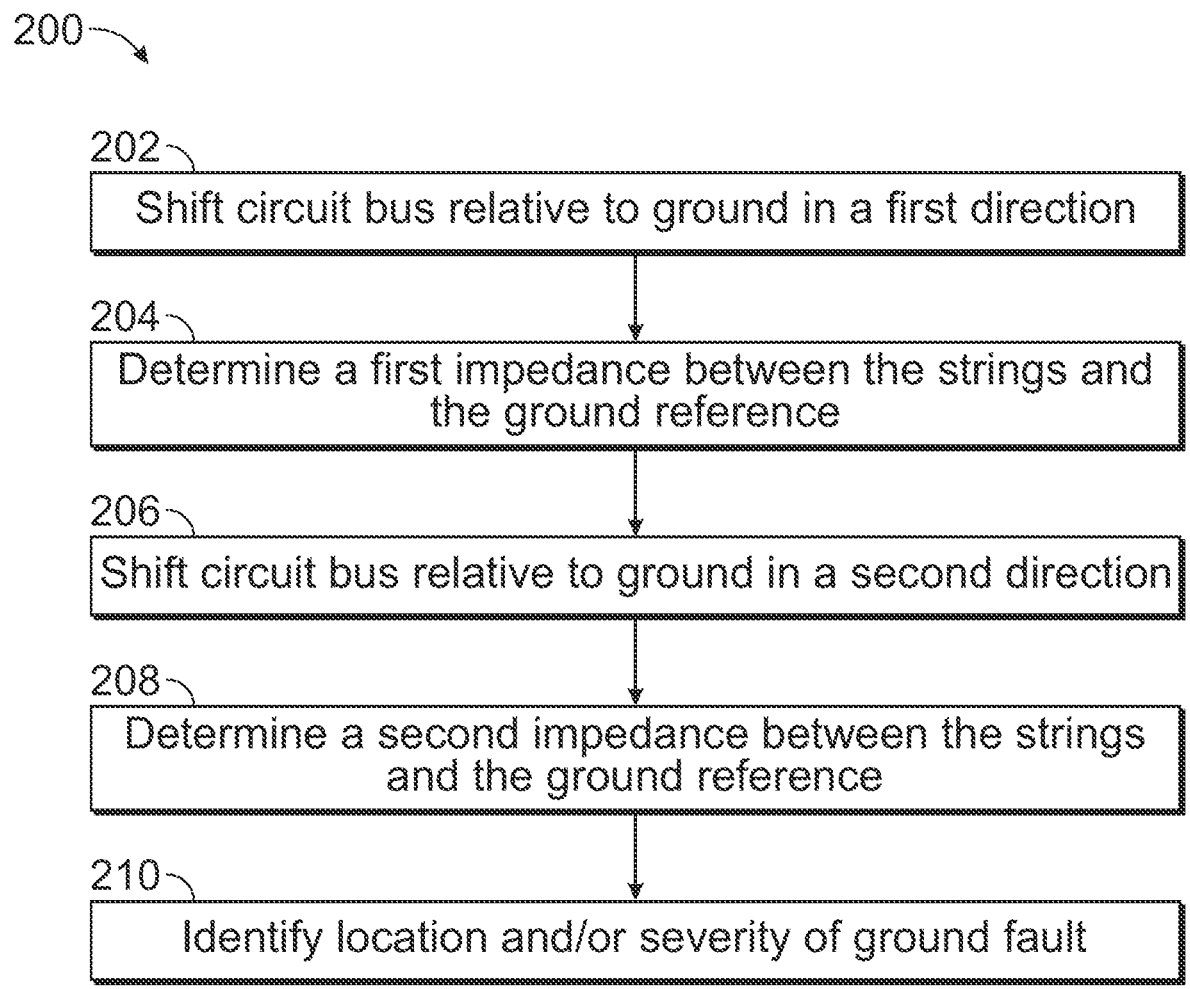
FIG. 2 illustrates a flowchart of one example of a method for identifying locations and/or magnitudes of ground impedances and/or faults in the strings of the circuit.

With continued reference to the circuit shown in FIG. 1, FIG. 2 illustrates a flowchart of one example of a method 200 for identifying locations and/or magnitudes of ground faults in the strings of the circuit. The method can be performed using existing components of the circuit and/or powered system. Stated differently, the location and/or magnitude of a ground fault in the strings can be identified by performing the operations described herein but without having to add any new components to the circuit or powered system. The impedance devices can be existing devices of the powered system that perform other operations, such as lights on a display inside a vehicle, resistors that dissipate regenerative energy created by dynamic breaking as heat, voltmeters/ammeters that are already present in the powered system (e.g., sensors that display the voltage of the strings to an operator), or the like. The switches can be existing switches or contactors used for other purposes, such as connecting or disconnecting the strings from the bus for controlling when the load(s) are receiving direct current from the strings, when the strings are being charged, etc.

At 202, the bus of the circuit is shifted relative to the ground reference in a first direction. This shift can be implemented by changing closing one of the switches while keeping the other of the switches open. This changes the potential of the bus when compared with the earth ground or the vehicle chassis (e.g., the ground reference connections). The shift can occur in the first direction by opening the positive side switch while keeping the negative side switch closed. The controller can communicate with the switches (e.g., via wired and/or wireless connections) to control which switch is open and which switch is closed.

At 204, a characteristic can be determined between the strings and the ground reference. The characteristic can be an impedance, voltage, or the like, that is measured by one or more of the impedance devices or that is calculated or otherwise derived from another characteristic measured by the impedance device(s). For example, an impedance device may measure a voltage and/or current between the strings and the ground reference. This or these measurements can be communicated or obtained by the controller, and the controller can calculate the impedance based on the measured voltage and/or current (e.g., by dividing the measured voltage by the measured current).

At 206, the bus of the circuit is shifted relative to the ground reference in a second direction that is different from the first direction. This shift can be implemented by changing which switch is open at 202, 204 and which switch is closed at 202, 204. For example, if the positive side switch is opened and the negative side switch is closed at 202, 204, then the positive side switch is closed and the negative side switch is opened at 206 (and 208, as described below). Conversely, if the positive side switch is closed and the negative side switch is open at 202, 204, then the positive side switch is open and the negative side switch is closed at 206 (and 208, as described below).

At 208, a characteristic between the strings and the ground reference is determined. The characteristic can be an impedance, voltage, or the like, that is measured, calculated, or otherwise derived by one or more of the impedance devices. The same or different impedance device used to determine the characteristic at 204 may be used to determine the characteristic at 208.

The bus of the circuit can be centered relative to ground when both switches are open. For example, the bus may not have any potential (positive or negative) while both the positive side switch and the negative side switch are open. Or the bus may not be centered relative to ground when both switches are open. The bus may have a positive or negative potential (e.g., voltage) while the positive side switch and the negative side switch are open. In either scenario, the potential of the bus can be shifted by opening and closing the switches and determining the characteristics as described above in connection with 202, 204, 206, 208.

The shifting of the bus can occur with both switches open or both switches closed. For example, both switches may be opened at 202 and the characteristic determined at 204 while both switches are open. Then, one or both switches may be closed at 206 and the other characteristic determined at 208 while one or both switches are closed. As another example, both switches may be closed at 202 and the characteristic determined at 204 while both switches are closed. Then, one or both switches may be opened at 206 and the other characteristic determined at 208 while one or both switches are open.

At 210, a ground fault is identified in the strings based on or using the characteristics that are determined. The ground fault can be identified by determining the location and/or severity of the fault. The location of the ground fault can be the battery cell, cell group, cell stack, or pack that has the ground fault (e.g., the cell, cell group, cell stack, or pack that is undesirably or unintentionally connected to a ground reference). The severity of the ground fault can be an impedance of the ground fault. A connection between the location of the ground fault in the strings and the ground can have an impedance or resistance. As the impedance or resistance of this connection increases, the severity of a subsequent ground fault may be reduced. As the impedance or resistance of this connection decreases, the severity of the ground fault increases.

Figure 3:
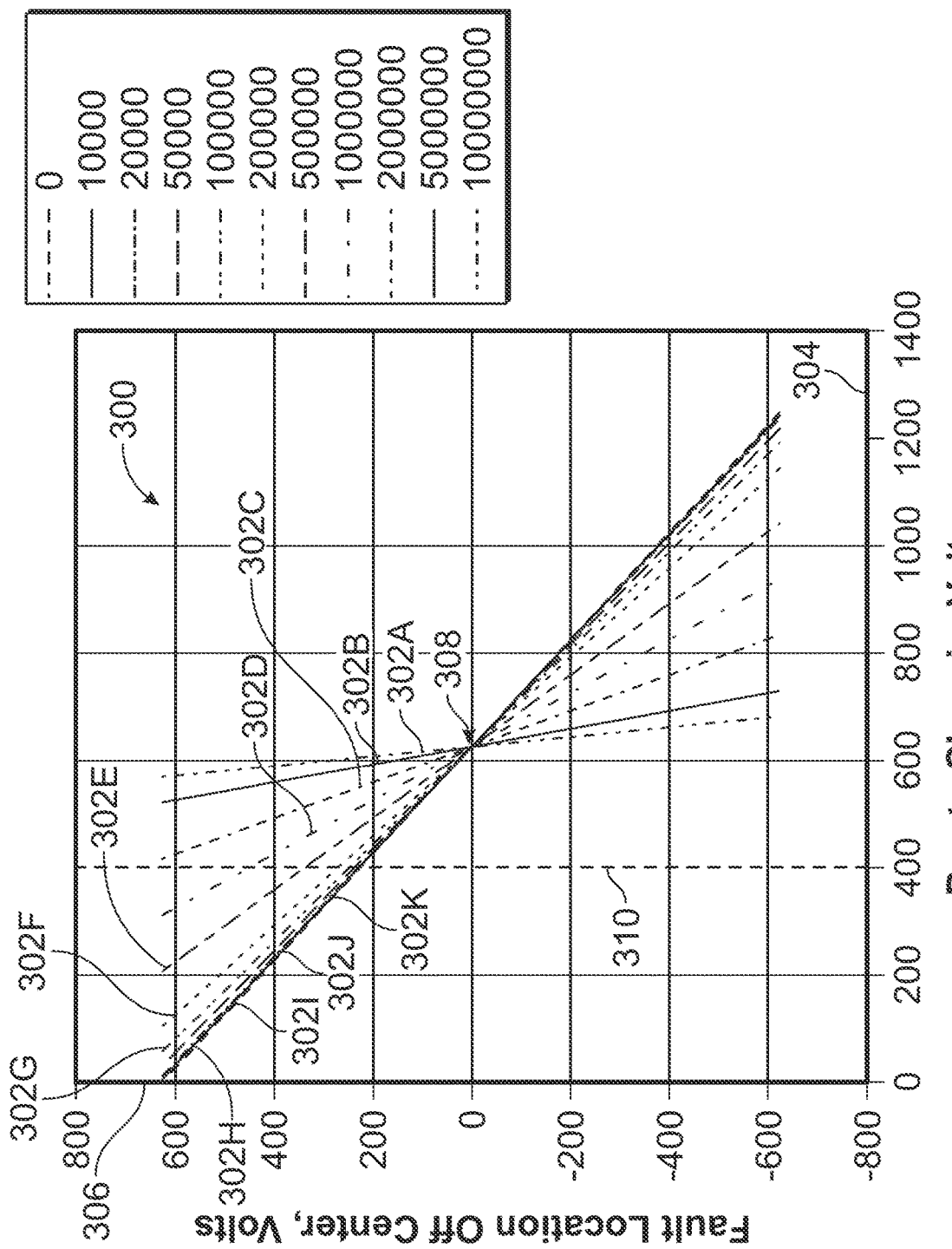
FIG. 3 illustrates a positive set of characteristic relationships associated with different severities of ground faults in battery strings while a conductive bus is shifted with switches open.
Figure 4:
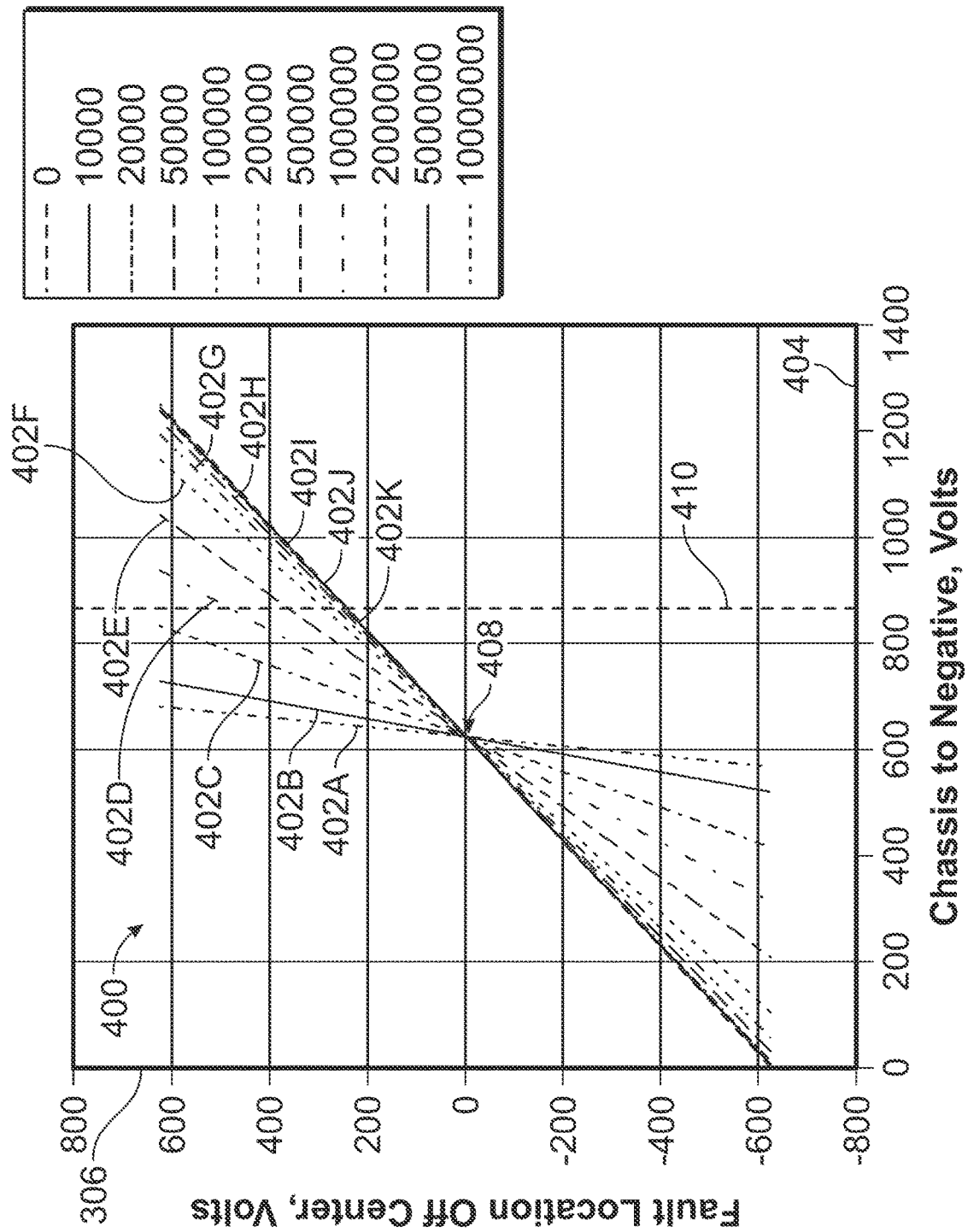
FIG. 4 illustrates a negative set of characteristic relationships associated with different severities of ground faults in the strings while the bus is shifted with both switches open.

FIG. 3 illustrates a positive set 300 of characteristic relationships 302A-K associated with different severities of ground faults in the strings while the bus is shifted with both switches open. The relationships shown in FIG. 3 are measured or calculated using one or more of the positive side impedance devices when the bus is shifted (e.g., shifted at 202 and measured or calculated at 204). FIG. 4 illustrates an example of a negative set 400 of characteristic relationships 402 (e.g., relationships 402A-K) associated with different severities of ground faults in the strings while the bus is intentionally centered. The bus may be intentionally centered when the impedances on both sides of the ground are equal, which also can mean that the potential on both sides of the ground are equal. Alternatively, the negative set of relationships shown in FIG. 4 may represent another state (e.g., when the bus is not intentionally centered). The relationships shown in FIG. 4 are measured or calculated using one or more of the negative side impedance devices when the bus is shifted (e.g., shifted at 202 and measured or calculated at 204). The different relationships in each set are associated with different locations (e.g., different cells, different cell groups, different cell stacks, or different packs) in the strings and different severities (e.g., different impedances between the location of the fault and the ground). The relationship associated with each location and severity can be empirically determined or measured, such as by creating ground faults at the different locations and measuring the characteristics using the positive and negative side impedance devices.

The positive side relationships 302A-K are shown alongside a horizontal axis 304 representative of different values of the characteristic determined using the positive side impedance device and a vertical axis 306 representative of different locations in the strings (e.g., different potentials of the strings). Because the cells in the strings may be partially or entirely connected in series with each other, different potentials along the vertical axis can represent different locations in the strings. The negative side relationships 402A-K are shown alongside a horizontal axis 404 representative of different values of the characteristic determined using the negative side impedance device and the vertical axis 306 described above.

In operation (according to one example), the switches can be opened, and the positive side impedance device can be used to measure or determine a characteristic of the bus. In the illustrated example, the positive side impedance device can measure or be used to calculate a voltage 310 of 400 volts as a characteristic, as shown in FIG. 3. But this single characteristic alone may not be useful for the controller to determine the location or severity of a ground fault. As shown in FIG. 3, the measured characteristic of 400 volts intersects 302D-K at different voltages along the vertical axis. Accordingly, from this single characteristic alone, it is unclear whether the location of the ground fault is at any value along the vertical axis that corresponds with the multiple intersections of 400 volts along the horizontal axis and the relationships 302D-K. Additionally, the relationships 302A-K intersect each other in a blind spot 308 where the severity of the ground fault would be unknown due to the characteristic value along the horizontal axis intersecting all of the relationships 302A-K at the blind spot.

A similar issue arises with the characteristic measured by the negative side impedance device. In operation (according to one example), the switches can be opened, and the negative side impedance device can be used to measure or determine a characteristic 410 of the bus, such as −850 volts (as shown in FIG. 4). But this single characteristic alone may not be useful for the controller to determine the location or severity of a ground fault due to the value of the characteristic along the horizontal axis intersecting multiple relationships 402D-K at different values along the vertical axis. As described above, from this single characteristic alone, it is unclear whether the location of the ground fault is at any value along the vertical axis that corresponds with the multiple intersections of −850 volts along the horizontal axis and the relationships 402D-K. Additionally, the relationships 402A-K intersect each other in another blind spot 408 where the severity of the ground fault would be unknown due to the characteristic value along the horizontal axis intersecting all of the relationships 402A-K at the blind spot.

Figure 5:
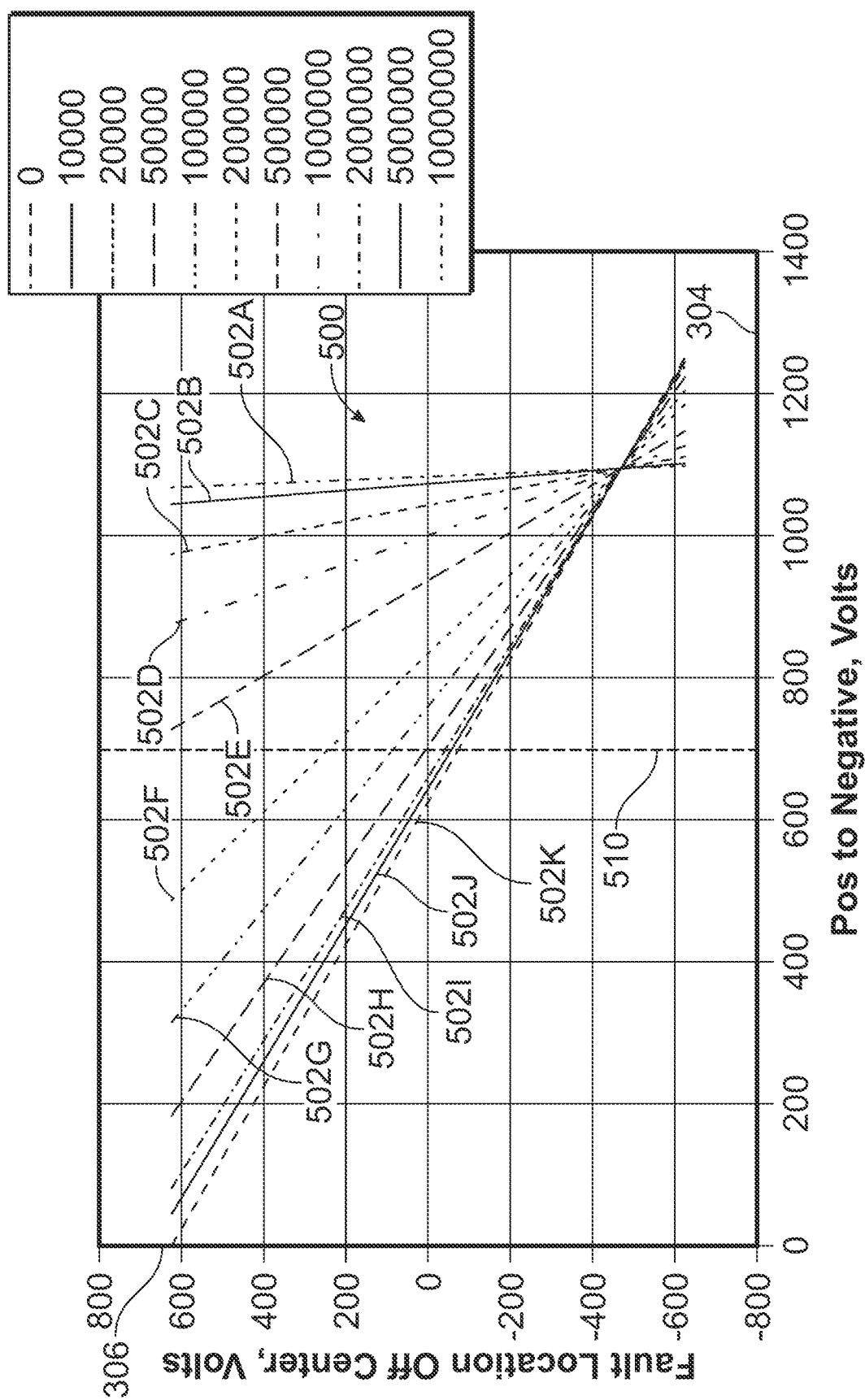
FIG. 5 illustrates another positive set of characteristic relationships associated with different severities of ground faults in the strings while the bus is shifted in a different direction than the positive set of characteristic relationships shown in FIG. 3.

The location and severity of the ground fault can be identified by shifting the bus, as described above. Shifting the bus can move or change the location of the blind spots described above. This creates a second equivalent circuit that can be used to solve for the unknowns as this second circuit introduces new or different impedance devices that were not in the circuit in the state when 202 and 204 are performed. FIG. 5 illustrates another positive set 500 of characteristic relationships 502A-K associated with different severities of ground faults in the strings while the bus is shifted in a different direction than the positive set 300 of characteristic relationships. For example, while the relationships 302A-K may be associated with the bus shifted by opening both switches, the relationships 502A-K may be associated with the bus shifted by closing one of the switches (e.g., the negative side switch) and keeping the other switch open. The relationships shown in FIG. 5 are measured or calculated using one or more of the positive side impedance devices when the bus is shifted (e.g., shifted at 206 and measured or calculated at 208). The positive side relationships 502A-K in FIG. 5 are shown alongside the horizontal axis 304 and the vertical axis 306 described above.

Figure 6:
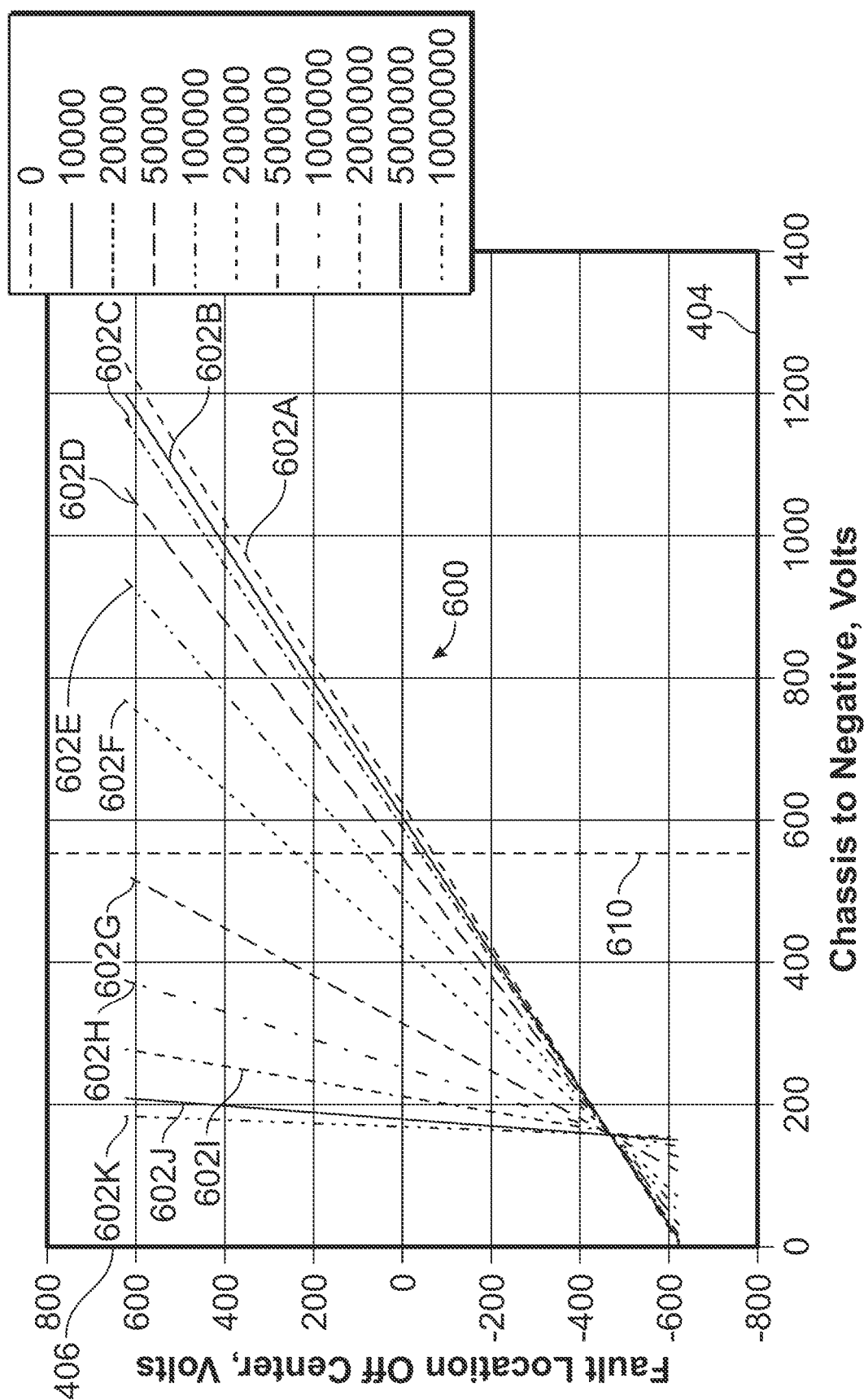
FIG. 6 illustrates another negative set of characteristic relationships associated with different severities of ground faults in the strings while the bus is shifted in a different direction than the relationships shown in FIG. 4.

FIG. 6 illustrates another negative set 600 of characteristic relationships 602A-K associated with different severities of ground faults in the strings while the bus is shifted in a different direction than the relationships 402A-K (e.g., with the negative side switch closed but the positive side switch remaining open). The relationships shown in FIG. 6 are measured or calculated using one or more of the negative side impedance devices when the bus is shifted (e.g., shifted at 206 and measured or calculated at 208). The different relationships in each set are associated with different locations in the strings and different severities. The relationship associated with each location and severity can be empirically determined or measured, such as by creating ground faults at the different locations and measuring the characteristics using the positive and negative side impedance devices. The negative side relationships 602 are shown alongside the horizontal axis 404 and the vertical axis 306 described above.

After measuring or calculating the voltage of 400 volts (shown in FIG. 3) using the positive side impedance device and measuring or calculating the voltage of 850 volts (shown in FIG. 4) using the negative side impedance device, the bus can be shifted by closing the positive side switch or the negative side switch, again measuring or calculating the voltage using the positive side impedance device, and again measuring or calculating the voltage using the negative side impedance device. In the example illustrated in FIGS. 5 and 6, the positive side impedance device measures or is used to calculate a voltage 510 of 700 volts (shown in FIG. 5) and the negative side impedance device measures or is used to calculate a voltage 610 of 550 volts (shown in FIG. 6).

These characteristics (e.g., voltages 310, 410, 510, 610) all intersect the relationship 302F, 402F, that are measured or calculated using the positive side impedance device and the negative side impedance device before shifting the bus (FIGS. 3 and 4) and after shifting the bus (FIGS. 5 and 6) can be used to determine the location and/or severity of a ground fault. In the example shown in FIGS. 3 through 6, the measured or calculated voltages 310, 410, 510, 610 all intersect the same locations in the strings (e.g., 275 volts along the vertical axes in FIGS. 3 through 6) for the relationships 302F, 402F, 502F, 602F (which are all labeled 200000 in the legends of FIGS. 3, 4, 5, and 6 to indicate the magnitude of the short, such as an impedance of 200,000 Ohms). Conversely, the calculated or measured voltages 310, 410, 510, 610 do not intersect the same location along the vertical axes for any other relationship. Accordingly, the location of the potential ground fault is at the string associated with the potential of 275 volts and the magnitude of the potential ground fault is identified as 200 kOhms. If the magnitude of the potential ground fault is less than a designated or customizable threshold, then the controller can determine that a ground fault exists.

Responsive to detecting such a ground fault, the controller can generate or annunciate an alarm (e.g., an audible sound, flashing light, or the like), notify an operator of the powered system of the identified fault (including the location and/or severity of the fault), and/or can isolate the string where the fault is located. The string can be isolated by opening switches on opposite sides of the string to disconnect the string from the bus. The controller can perform this test for the ground fault one or more times during operation of the powered system or energy storage system. For example, the controller may perform this test once a day (or more or less often) and while the battery strings are not being charged or powering any load. The controller can cycle through a series of closing the negative side switch (while the positive side switch is open) and then closing the positive side switch (while the negative side switch is open). The controller can obtain the measurements obtained using the positive side impedance device and the negative side impedance device during this series (a) while the positive and negative side switches are open (e.g., during the time between switching the negative side switch from closed to open while the positive side switch is still open or during the time before closing the positive side switch while the negative side switch is still open) and (b) while the negative side switch or the positive side switch is closed. The controller can use these measurements (or characteristics) to determine the location and/or severity of a ground fault, as described above.

Optionally, the controller can perform this test for a ground fault by identifying a time period (even if a transitory or short time period) that both the positive and negative side switches are open at the same time. The controller can use one or more of the impedance devices to measure or calculate the potential on the bus. If the bus has a positive or negative potential, then the controller can identify a ground fault within the battery strings without having to close either the positive or negative side switch. The controller can generate or annunciate the alarm that a ground fault is detected, but may not notify the operator of the location or severity of the ground fault. The controller can control the positive and negative side switches to remain open to prevent the ground fault from damaging any components of the powered system or energy storage system.

The energy storage system may have several of the circuits shown in FIG. 1 that are coupled with one or more of the same loads. Each circuit may have a separate controller, or the same controller may be used to conduct the ground fault testing methods described herein. The time required to test the strings in the different circuits for ground faults may be reduced by examining multiple strings at the same time (e.g., dividing the circuits into different sets and smaller sets during each test iteration until the circuit with the ground fault is identified). For example, the energy storage system may have eight strings with an undetected ground fault in the fifth strings. The controller(s) can examine the potentials of the buses connected with the first through fourth strings to determine whether a ground fault exists, as described above. If no ground fault is detected, then the controller(s) can examine the potentials of the buses connected with the fifth through eighth strings to determine whether a ground fault exists. If a ground fault is detected in the fifth through eighth strings, then the controller(s) can examine the potentials of the buses in the fourth and fifth strings to determine whether a ground fault exists. When the presence of the ground fault is detected, the controller(s) can then separately examine the potentials of the buses connected with the fourth string and then the fifth string to determine that the ground fault is present in the fifth string. The controller can then shift the bus connected with the fifth string to determine the location and severity of the ground fault in the fifth string, as described above. Testing the many strings in this way can reduce the number of tests needed to identify the ground fault.

The bus of the circuit may be shifted in one or more ways other than closing one of the positive or negative side switch (as described above). For example, one or more of the inverters in the circuit can be fired or closed to shift the strings with respect to ground. As another example, the precharge switch or contactor can be closed to connect the resistor and/or additional circuitry to the bus (where the resistor and/or additional circuitry is referenced or connected to the ground or ground reference).

The detection system optionally can perform a tan delta test using components already present in the circuit to identify a failure or decrease in the insulation around the bus or other conductive components. The controller can activate at least one of the inverters at a first frequency to either conduct current from the strings or conduct current to the strings. For example, the controller can turn switches within the inverter between open and closed states at the first frequency to allow current to be conducted from the strings through the inverter(s) toward the load(s) at the first frequency or to allow current to be conducted through the inverter(s) toward the strings at the first frequency. Activating (or firing) the inverter(s) at the first frequency can create a waveform of the current that exits the inverter(s), such as a sinusoidal waveform.

One or more of the impedance devices can measure the current conducted through the bus by this waveform being generated. For example, one or more of the impedance devices can represent or include an ammeter that measures current conducted through the bus. The controller can then activate the inverter(s) at a second frequency that is different from the first frequency. The inverter(s) that are activated at the second frequency can be the same or different than the inverter(s) that were activated at the first frequency. The same or other impedance device(s) can measure the current again while the inverter(s) are activated at the second frequency. The controller can then calculate a phase angle (and optionally, an impedance) from these measurements of the current (at the first frequency and the second frequency). The controller compares the phase angle to a threshold and, if the phase angle exceeds the threshold, the controller determines that the insulation (e.g., around the bus and/or strings) has failed or needs maintenance or replacement. Optionally, the controller can repeatedly calculate the phase angle and determine that the insulation has failed, is failing, or needs maintenance or replacement responsive to the phase angle increasing over time or increasing at a rate that exceeds a designated rate (even if the phase angle does not yet exceed the threshold). Optionally, the phase angle of a first string may be compared with the phase angle of another string. If the phase angles differ, then this difference can indicate a problem (e.g., insulation failure). The controller can then annunciate an alarm (as described above), send a signal to another device (e.g., a maintenance scheduling system) to schedule maintenance of the circuit, and/or deactivate the strings (e.g., by opening the positive and negative side switches) to prevent the insulation fault from causing damage.

In one embodiment, a method for identifying a location and/or magnitude of a ground fault in a circuit having a bus that connects battery strings with loads and a ground reference between the loads is provided. The method can include shifting the bus of the circuit relative to the ground reference in a first direction, determining a first impedance in the bus between the battery strings and the ground reference, shifting the bus of the circuit relative to the ground reference in a second direction, determining a second impedance in the bus between the battery strings and the ground reference, and identifying a location and/or severity of the ground fault based on a relationship between the first impedance and the second impedance.

The bus can be shifted relative to the ground reference in the first direction by closing a positive side switch disposed between a positive end of the battery strings and the loads. The bus can be shifted relative to the ground reference in the second direction by closing a negative side switch disposed between a negative end of the battery strings and the loads. The impedances can include one or more of voltage amplifiers, light emitting diodes, or grid resistors.

Identifying the battery cell can include identifying a first relationship between the first impedance that is measured and voltages of the battery cells, identifying a second relationship between the second impedance that is determined and the voltages of the battery cells, and determining which of the battery cells is associated with the first relationship and the second relationship. Each of the first relationship and the second relationship can be included in different sets of different relationships with each of the different relationships associated with a different cell of the battery cells. The different relationships in each of the different sets can intersect each other at an intersecting blind spot and shifting the bus in the first direction or the second direction changes the intersecting blind spot.

The bus can be coupled with a power source that charges the battery strings by a first contactor and with a load that is powered by the battery strings by a second contactor. Shifting the bus in the first direction, determining the first impedance, shifting the bus in the second direction, and determining the second impedance can occur while both the first contactor and the second contactor are open.

The bus can be coupled with a power source that charges the battery strings by a first contactor and with a load that is powered by the battery strings by a second contactor. The method also can include opening a positive side switch disposed between a positive end of the battery strings and the loads and a negative side switch disposed between a negative end of the battery strings and the loads. The positive side switch and the negative side switch can be opened while the first contactor and the second contactor are open. The method also can include determining whether the bus is shifted in the first direction or the second direction by determining a third impedance in the loads while the positive side switch and the negative side switch are open, the third impedance measured while the first contactor and the second contactor are open and preventing either the first contactor or the second contactor from closing responsive to determining that the bus has shifted based on the third impedance. The circuit can be a first circuit of several circuits, and shifting the bus in the first direction, determining the first impedance, shifting the bus in the second direction, and determining the second impedance can be performed at the same time for different sets of the circuits to determine whether the ground fault exists in any of the circuits in the set. The bus can be shifted relative to the ground reference in the first direction and in the second direction by closing one or more switches between a resistor and the loads.

The method also can include one or more of generating an alert to notify an operator of the battery cell having the ground fault, and/or deactivating or disconnecting the battery cell having the ground fault from the loads.

The bus can be shifted relative to the ground reference in the first direction and in the second direction by one or more of activating an inverter coupled with the battery strings and/or coupling a resistor and additional circuitry that are referenced to the ground reference to the bus.

In one embodiment, another method is provided that includes activating an inverter coupled with at least one battery string having two or more battery cells. The inverter is activated at a first frequency to one or more of send first current to or draw the first current from the at least one battery string. The method also includes determining the first current that is sent to or drawn from the at least one battery string, activating the inverter at a second frequency to one or more of send second current to or draw the second current from the at least one battery string, determining the second current that is sent to or drawn from the at least one battery string, determine an impedance and phase angle of the impedance from the first current and the second current that are measured, and identifying an insulation fault in a circuit having the at least one battery string and the inverter, the insulation fault identified responsive to the phase angle exceeding a threshold or the phase angle changing with respect to time. The method also can include scheduling maintenance of the circuit or deactivating the at least one battery string responsive to identifying the insulation fault.

In one embodiment, a system (e.g., a ground impedance and fault detection system) is provided and includes a controller configured to identify a location of a ground fault in a circuit having a bus that connects battery strings with loads and a ground reference between the loads. The controller is configured to identify the location of the ground fault by shifting the bus of the circuit relative to the ground reference in a first direction, determine a first impedance in the bus between the battery strings and the ground reference, shift the bus of the circuit relative to the ground reference in a second direction, determine a second impedance in the bus between the battery strings and the ground reference, and identify a battery cell of several battery cells in the battery strings as having the ground fault based on a relationship between the first impedance and the second impedance.

The controller can be configured to shift the bus relative to the ground reference in the first direction by closing a positive side switch disposed between a positive end of the battery strings and the loads. The controller can be configured to shift the bus relative to the ground reference in the second direction by closing a negative side switch disposed between a negative end of the battery strings and the loads. The bus may not be centered with respect to the ground reference while the bus is shifted.

As used herein, the terms "processor" and "computer," and related terms, e.g., "processing device," "computing device," and "controller" may be not limited to just those integrated circuits referred to in the art as a computer, but refer to a microcontroller, a microcomputer, a programmable logic controller (PLC), field programmable gate array, and application specific integrated circuit, and other programmable circuits. Suitable memory may include, for example, a computer-readable medium. A computer-readable medium may be, for example, a random-access memory (RAM), a computer-readable non-volatile medium, such as a flash memory. The term "non-transitory computer-readable media" represents a tangible computer-based device implemented for short-term and long-term storage of information, such as, computer-readable instructions, data structures, program modules and sub-modules, or other data in any device. Therefore, the methods described herein may be encoded as executable instructions embodied in a tangible, non-transitory, computer-readable medium, including, without limitation, a storage device and/or a memory device. Such instructions, when executed by a processor, cause the processor to perform at least a portion of the methods described herein. As such, the term includes tangible, computer-readable media, including, without limitation, non-transitory computer storage devices, including without limitation, volatile and non-volatile media, and removable and non-removable media such as firmware, physical and virtual storage, CD-ROMS, DVDs, and other digital sources, such as a network or the Internet.

The singular forms "a", "an", and "the" include plural references unless the context clearly dictates otherwise. "Optional" or "optionally" means that the subsequently described event or circumstance may or may not occur, and that the description may include instances where the event occurs and instances where it does not. Approximating language, as used herein throughout the specification and claims, may be applied to modify any quantitative representation that could permissibly vary without resulting in a change in the basic function to which it may be related. Accordingly, a value modified by a term or terms, such as "about," "substantially," and "approximately," may be not to be limited to the precise value specified. In at least some instances, the approximating language may correspond to the precision of an instrument for measuring the value. Here and throughout the specification and claims, range limitations may be combined and/or interchanged, such ranges may be identified and include all the sub-ranges contained therein unless context or language indicates otherwise.

This written description uses examples to disclose the embodiments, including the best mode, and to enable a person of ordinary skill in the art to practice the embodiments, including making and using any devices or systems and performing any incorporated methods. The claims define the patentable scope of the disclosure, and include other examples that occur to those of ordinary skill in the art. Such other examples are intended to be within the scope of the claims if they have structural elements that do not differ from the literal language of the claims, or if they include equivalent structural elements with insubstantial differences from the literal language of the claims.

What is claimed is:

1. A method for identifying a location of a ground fault in a circuit having a bus that connects battery strings with loads and a ground reference between the loads, the method comprising:
    shifting the bus of the circuit relative to the ground reference in a first direction;
    determining a first impedance in the circuit between the battery strings and the ground reference;
    shifting the bus of the circuit relative to the ground reference in a second direction;
    determining a second impedance in the circuit between the battery strings and the ground reference; and
    identifying a location and/or severity of the ground fault based on a relationship between the first impedance and the second impedance.

2. The method of claim 1, wherein the bus is shifted relative to the ground reference in the first direction by closing a positive side switch disposed between a positive end of the battery strings and the loads.

3. The method of claim 2, wherein the bus is shifted relative to the ground reference in the second direction by closing a negative side switch disposed between a negative end of the battery strings and the loads.

4. The method of claim 1, wherein the impedances include one or more of voltage amplifiers, light emitting diodes, or grid resistors.

5. The method of claim 1, wherein identifying the battery cell includes:
    identifying a first relationship between the first impedance that is measured and voltages of the battery cells;
    identifying a second relationship between the second impedance that is determined and the voltages of the battery cells; and
    determining which of the battery cells is associated with the first relationship and the second relationship.

6. The method of claim 5, wherein each of the first relationship and the second relationship is included in different sets of different relationships with each of the different relationships associated with a different cell of the battery cells.

7. The method of claim 6, wherein the different relationships in each of the different sets intersect each other at an intersecting blind spot, and shifting the bus in the first direction or the second direction changes the intersecting blind spot.

8. The method of claim 1, wherein the bus is coupled with a power source that charges the battery strings by a first contactor and with a load that is powered by the battery strings by a second contactor, wherein shifting the bus in the first direction, determining the first impedance, shifting the bus in the second direction, and determining the second impedance occurs while both the first contactor and the second contactor are open.

9. The method of claim 1, wherein the bus is coupled with a power source that charges the battery strings by a first contactor and with a load that is powered by the battery strings by a second contactor, and further comprising:
    opening a positive side switch disposed between a positive end of the battery strings and the loads and a negative side switch disposed between a negative end of the battery strings and the loads, the positive side switch and the negative side switch opened while the first contactor and the second contactor are open;
    determining whether the bus is shifted in the first direction or the second direction by determining a third impedance in the loads while the positive side switch and the negative side switch are open, the third impedance measured while the first contactor and the second contactor are open; and
    preventing either the first contactor or the second contactor from closing responsive to determining that the bus has shifted based on the third impedance.

10. The method of claim 9, wherein the circuit is a first circuit of several circuits, wherein shifting the bus in the first direction, determining the first impedance, shifting the bus in the second direction, and determining the second impedance is performed at the same time for different sets of the circuits to determine whether the ground fault exists in any of the circuits in the set.

11. The method of claim 9, wherein the bus is shifted relative to the ground reference in the first direction and in the second direction by closing one or more switches between a resistor and the loads.

12. The method of claim 9, further comprising:
generating an alert to notify an operator of the battery cell having the ground fault.

13. The method of claim 1, wherein the bus is shifted relative to the ground reference in the first direction and in the second direction by one or more of activating an inverter coupled with the battery strings or coupling a resistor and additional circuitry that are referenced to the ground reference to the bus.

14. The method of claim 9, further comprising:
deactivating or disconnecting the battery cell having the ground fault from the loads.

15. A method comprising:
activating an inverter coupled with at least one battery string having two or more battery cells, the inverter activated at a first frequency to one or more of send first current to or draw the first current from the at least one battery string;
determining the first current that is sent to or drawn from the at least one battery string;
activating the inverter at a second frequency to one or more of send second current to or draw the second current from the at least one battery string;
determining the second current that is sent to or drawn from the at least one battery string;
determine an impedance and phase angle of the impedance from the first current and the second current that are measured; and
identifying an insulation fault in a circuit having the at least one battery string and the inverter, the insulation fault identified responsive to the phase angle exceeding a threshold or the phase angle changing with respect to time.

16. The method of claim 15, further comprising:
scheduling maintenance of the circuit or deactivating the at least one battery string responsive to identifying the insulation fault.

17. A system comprising:
a controller configured to identify a location of a ground fault in a circuit having a bus that connects battery strings with loads and a ground reference between the loads, the controller configured to identify the location of the ground fault by shifting the bus of the circuit relative to the ground reference in a first direction, determining a first impedance in the circuit between the battery strings and the ground reference, shifting the bus of the circuit relative to the ground reference in a second direction, determining a second impedance in the circuit between the battery strings and the ground reference, and identifying a battery cell of several battery cells in the battery strings as having the ground fault based on a relationship between the first impedance and the second impedance.

18. The system of claim 17, wherein the controller is configured to shift the bus relative to the ground reference in the first direction by closing a positive side switch disposed between a positive end of the battery strings and the loads.

19. The system of claim 18, wherein the controller is configured to shift the bus relative to the ground reference in the second direction by closing a negative side switch disposed between a negative end of the battery strings and the loads.

20. The system of claim 17, wherein the bus is not centered with respect to the ground reference while the bus is shifted.

* * * * *